United States Patent [19]
Ishida et al.

[11] Patent Number: 6,040,019
[45] Date of Patent: *Mar. 21, 2000

[54] METHOD OF SELECTIVELY ANNEALING DAMAGED DOPED REGIONS

[75] Inventors: Emi Ishida, Sunnyvale; Xiao-Yu Li; Sunil D. Mehta, both of San Jose, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/799,230

[22] Filed: Feb. 14, 1997

[51] Int. Cl.[7] .................. C23C 14/00; H01L 21/263; B05D 3/06
[52] U.S. Cl. .................. 427/526; 427/527; 427/555; 427/559; 438/514; 438/530; 438/565; 438/770; 438/776; 438/778; 438/795
[58] Field of Search .................. 427/554, 555, 427/596, 527, 526, 559; 438/766, 769, 770, 775, 776, 791, 792, 778, 514, 530, 565, 795

[56] References Cited

U.S. PATENT DOCUMENTS

| | | |
|---|---|---|
| 4,229,502 | 10/1980 | Wu et al. .................. 427/555 |
| 4,292,091 | 9/1981 | Togei .................. 427/555 |
| 4,318,752 | 3/1982 | Tien .................. 427/555 |
| 4,377,421 | 3/1983 | Wada et al. .................. 427/555 |
| 4,381,201 | 4/1983 | Sakurai .................. 427/555 |
| 4,411,929 | 10/1983 | Sato et al. .................. 427/527 |
| 4,465,705 | 8/1984 | Ishihara et al. .................. 427/527 |
| 4,473,433 | 9/1984 | Bosch et al. .................. 427/555 |
| 4,482,393 | 11/1984 | Nishiyama et al. . |
| 4,500,365 | 2/1985 | Mori . |
| 4,601,779 | 7/1986 | Abernathey et al. .................. 427/527 |
| 4,619,036 | 10/1986 | Havemann et al. .................. 427/527 |
| 4,704,302 | 11/1987 | Bruel et al. .................. 427/527 |
| 4,924,278 | 5/1990 | Logie . |
| 5,227,329 | 7/1993 | Kobayashi et al. . |
| 5,316,969 | 5/1994 | Ishida et al. . |
| 5,514,880 | 5/1996 | Nishimura et al. . |
| 5,620,931 | 4/1997 | Tsang et al. . |
| 5,766,695 | 6/1998 | Nguyen et al. .................. 427/526 |
| 5,795,627 | 8/1998 | Mehta et al. .................. 427/555 |
| 5,858,473 | 1/1999 | Yamazaki et al. .................. 427/554 |
| 5,871,826 | 2/1999 | Mei et al. .................. 427/596 |

Primary Examiner—Marianne Padgett
Attorney, Agent, or Firm—Fliesler, Dubb, Meyer & Lovejoy LLP

[57] ABSTRACT

A method of forming a region of impurity in a semiconductor substrate with minimal damage. The method includes the steps of: forming a reaction-inhibiting impurity region in the semiconductor substrate to a depth below the semiconductor substrate; and applying laser energy to the semiconductor substrate at a sufficient magnitude to liquify the semiconductor substrate in the region.

23 Claims, 4 Drawing Sheets

METHOD OF SELECTIVELY ANNEALING DAMAGED DOPED REGIONS

CROSS-REFERENCE TO RELATED APPLICATIONS

The following co-pending U.S. patent applications are assigned to the assignee of the present application, are related to the present application and its disclosure and are incorporated herein by reference:

(A) Ser. No. 08/799,153, now U.S. Pat. No. 5,904,575 [Attorney Docket No. AMDI8197MCF/LEV] by E. Ishida, et al. and entitled METHOD AND APPARATUS INCORPORATING NITROGEN SELECTIVELY FOR DIFFERENTIAL OXIDE GROWTH.

(B) Ser. No. 08/799,236, now U.S. Pat. No. 5,795,627 [Attorney Docket No. AMDI8201MCF/KJD] by Mehta, et al. and entitled A METHOD FOR ANNEALING DAMAGED SEMICONDUCTOR REGIONS ALLOWING FOR ENHANCED OXIDE GROWTH.

(C) Ser. No. 08/799,235, now U.S. Pat. No. 5,885,904 [Attorney Docket No. AMDI8202MCF/KJD] by Mehta, et al. and entitled A METHOD TO INCORPORATE, AND A DEVICE HAVING, OXIDE ENHANCEMENT DOPANTS USING GAS IMMERSION LASER DOPING (GILD) FOR SELECTIVELY GROWING AN OXIDE LAYER.

(D) Ser. No. 08/689,523, now U.S. Pat. No. 5,942,780 by Barsan, et al. and entitled AN INTEGRATED CIRCUIT HAVING, AND PROCESS PROVIDING, DIFFERENT OXIDE LAYER THICKNESSES ON A SUBSTRATE.

(E) Ser. No. 08/561,306, now U.S. Pat. No. 5,672,521 by Barsan, et al. and entitled MULTIPLE GATE OXIDE THICKNESSES ON A WAFER SUBSTRATE.

(F) Ser. No. 08/699,401, now U.S. Pat. No. 5,960,274 by Mehta, entitled OXIDE FORMATION PROCESS FOR MANUFACTURING PROGRAMMABLE LOGIC DEVICE.

CROSS-REFERENCE TO RELATED PATENTS

The following U.S. Patent is assigned to the assignee of the present application, is related to the present application and its disclosure is incorporated herein by reference:

(A) U.S. Pat. No. 4,924,278 issued May 8, 1990, to Logie and entitled EEPROM USING A MERGE SOURCE AND CONTROL GATE.

BACKGROUND OF THE INVENTION

1. Field of the Invention

The invention relates to the process for providing nitrogen in a semiconductor substrate, particularly for forming an oxide region using differential oxide growth.

2. Description of the Related Art

A prevalent trend in the semiconductor industry is to increase the density of semiconductor devices formed on silicon substrates.

Programmable logic devices (PLD) are circuits which can be configured by a user to perform logic functions or serve as memory arrays. Generally, PLDs include a programmable array of cells and array control circuitry which is utilized to program the array with the desired implementation. The programmable array comprises a series of low-voltage, short channel floating gate transistors which store charge to reflect whether a particular cell is programmed with a bit of data. The programmed array reflects in a particular user's individual configuration for the programmable device, allowing users to customize the programmable logic device for a number of different applications.

One type of programmable logic device which has become popular due to its performance and cost characteristics are electrically erasable ($E^2$) CMOS programmable devices.

Erasable CMOS technology is based on the concept of a stored charge on a floating gate. Electrons are transferred to the gate through a physical mechanism known as Fowler-Nordheim tunneling. For an electrically erasable cell, a tunnel oxide is present between the source and drain regions and the floating gate that is about one-third of the thickness of a traditional transistor gate oxide. Fowler-Nordheim tunneling involves placing a potential across the tunnel oxide which distorts the electric field and allows electrons to traverse the tunnel oxide upon which they become trapped on a floating gate.

The control circuitry of the cell—the program transistors—essentially comprise high voltage transistors capable of sustaining high electric fields. So called read transistors, which operate at low voltage, include a first junction, second junction and gate (defined by the word line of the device). The gate is comprised of a program junction separated from a floating gate by an oxide layer having a thickness of approximately 180 Å. The program transistor includes a first junction, second junction and a gate which also rests on the oxide layer. The memory cell will also include a floating gate, separated from the program junction by a tunnel oxide which may be activated by the control gate. The thickness of tunnel oxide is in a range of approximately 80–100 Å.

The trend of $E^2$ PLD devices has been toward lower and lower supply voltages. Consequently, this has required a corresponding scaling down of transistor size, both in terms of channel length and junction depths, and the gate oxide, including two different oxide thicknesses for the gate and tunnel oxides.

In reducing the size of semiconductor devices much of the focus has been on reducing the length L of the gate. As the gate length L is reduced, however, the device size must also be reduced in the vertical direction—that is, the source-drain junction depths ($x_j$) and oxide thicknesses must be reduced.

There are generally two ways to make a doped region shallower. One way is to implant ions at a lower energy (e.g., 1 keV instead of 20 keV). The second way to reduce the amount of dopant diffusion is to reduce anneal time and/or temperature. Annealing and other heat steps cause the doped regions to diffuse, thus causing the doped regions to expand and deepen in thickness. The longer the time and the higher the temperature of a heat step, the deeper the doped regions become.

In common processes, both deep source-drain and source-drain extension regions are annealed simultaneously, or source-drain extension regions are annealed and then re-exposed to anneal temperatures during the deep source-drain region anneal. These anneal steps cause both types of regions to deepen as a result of diffusion. By annealing for a shorter time or at a lower temperature, the source-drain extension region thickness can be minimized, especially if a low energy implant of the source-drain extension region is also used. Nonetheless, a reduced anneal would also cause the deep source-drain regions to be formed too shallow. Too shallow an deep source-drain region is undesirable because it alters device characteristics (e.g., device resistivity and drive current) and makes formation of reliable contacts difficult. Silicidation of deep source-drain regions eats into the deep source-drain depth, causing an already shallow deep source-drain region to be even further reduced.

Thus, even using a low energy source-drain extension implant with conventional device formation processes, the manufacturer has very limited control over maintaining shallow source-drain extension thickness because of diffusion resulting from subsequent anneal and other heat steps and because deep source-drain depth must be maintained.

As the gate oxide thicknesses have been scaled down, they have reached and become even thinner than the tunnel oxide on lightly or undoped silicon. Traditionally, the manufacturing process for implementing all four types of cells requires a large number of sequential process steps. The reduction in processing steps, and specifically masking steps, is an objective of nearly every process engineer. Each savings of a masking step may result in a significant saving in the cost of manufacture of the particular device.

SUMMARY OF THE INVENTION

The invention, roughly described, comprises a method of forming a region of impurity in a semiconductor substrate with minimal damage. The method includes the steps of: forming a reaction-inhibiting impurity region in the semiconductor substrate to a depth below the semiconductor substrate; and applying laser energy to the semiconductor substrate at a sufficient magnitude to liquify the semiconductor substrate in the region, and allowing the region to cool.

In a further embodiment of the present invention, the impurity is nitrogen. The method may further include the step of growing an oxide layer having a first thickness above the region and a second thickness.

In one aspect, the step of forming comprises ion implanting the impurity into the substrate. In a further aspect, the step of forming comprises placing the substrate in an atmosphere containing an oxide growth inhibiting compound, and applying laser energy to the surface of the substrate to complete a non-melt gas immersion laser doping of the nitrogen in the substrate.

In yet another aspect of the invention, the method may utilize an excimer laser such as an XeCl laser having a wavelength of 308 nm.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION OF THE PREFERRED EMBODIMENTS

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

Figure 1:
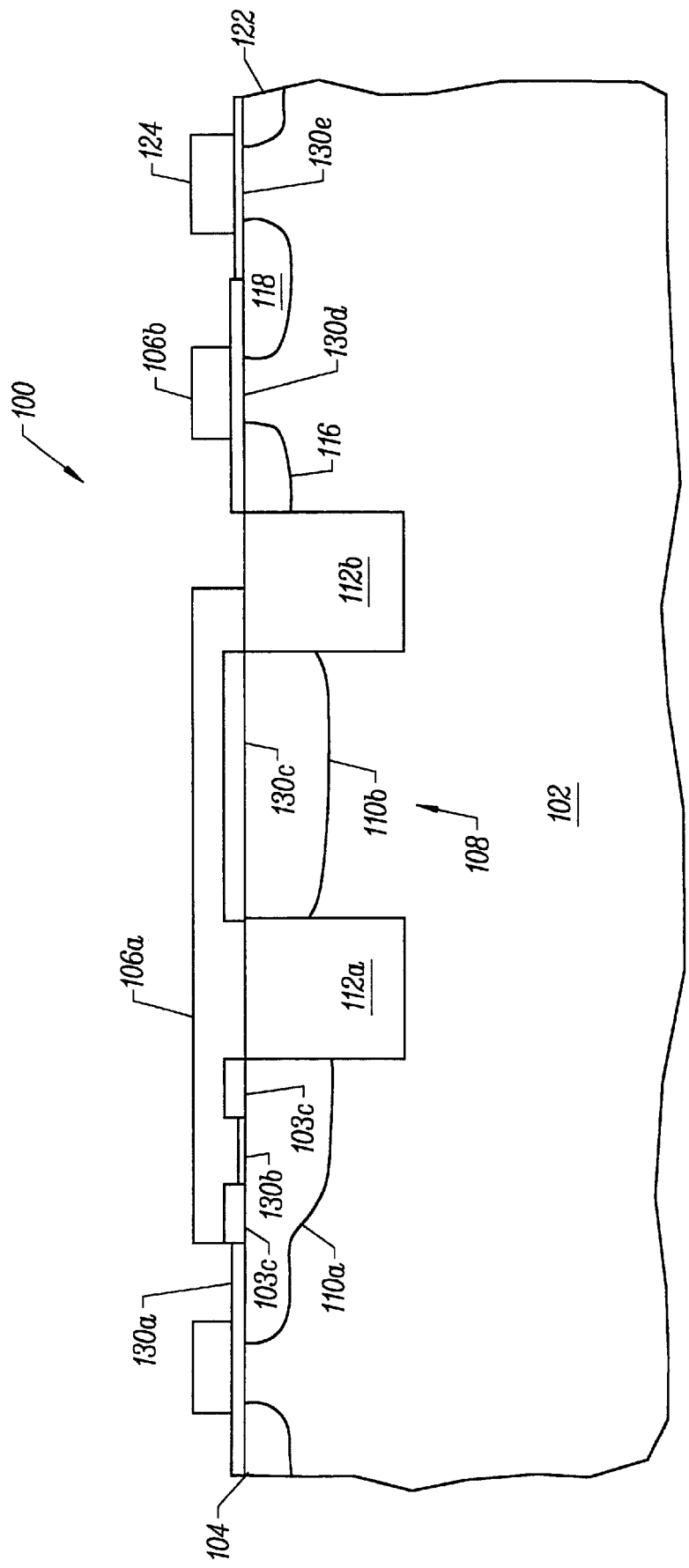
FIG. 1 is a cross-section of a conventional $E^2$PROM memory cell which may be formed in accordance with the present invention.

FIG. 1 is an illustrative cross-section of an exemplary $E^2$PROM memory cell. FIG. 1 does not show an actual cross section of a manufactured $E^2$PROM cell, but rather an illustrative cross-section of the various transistors and their internal connections. The process of the present invention is useful in forming an $E^2$PROM memory cell. However, the method of the present invention is not limited to uses with $E^2$PROM memory technology and one of average skill in the art will readily recognize the myriad uses of the method in any application requiring a shallow junction formation uniform oxide layer at a relatively small thickness.

As shown in FIG. 1, the $E^2$PROM memory cell 100 is formed on a semiconductor substrate 102 having a surface 104. The cell comprises floating gates 106a–b, control gate 108 and program junctions 110a–b. Field oxide regions 112a–b separate active regions of the semiconductor devices. A sense transistor 114 is formed by junction regions 116 and 118 and floating gate 106b, while the read transistor 120 is formed by junction region 118, junction region 122 and gate 124. Various thicknesses of an oxide layer 130 cover the surface 104 of semiconductor 102. The oxide 130 has a thickness of, for example, 150 Å at region 130a, a thickness of 88Å at region 130b, the tunnel oxide region, a thickness of 180 Å at region 130c overlying the control gate and a portion of program junction 110a a, a thickness of 150 Å over the channel of sense transistor 114 at region 130d, and a thickness of 80 Å over the channel of read transistor 120 at region 130e.

These oxide thicknesses have been provided for illustrating this particular embodiment. In other embodiments, other oxide thicknesses may be used. For example, other oxide thicknesses are described in the above-referenced patent applications entitled AN INTEGRATED CIRCUIT HAVING, AND PROCESS PROVIDING, DIFFERENT OXIDE LAYER THICKNESSES ON A SUBSTRATE. It should also be understood that for convenience, the oxide layers shown in the following figures is depicted growing only upwards from the oxidated surface. In actuality, the oxide layer grows bidirectionally above and below the initial surface.

Operation of memory cell 100 is also described in detail in the above-referenced patent application entitled AN INTEGRATED CIRCUIT HAVING, AND PROCESS PROVIDING, DIFFERENT OXIDE LAYER THICKNESSES ON A SUBSTRATE.

Figure 2:
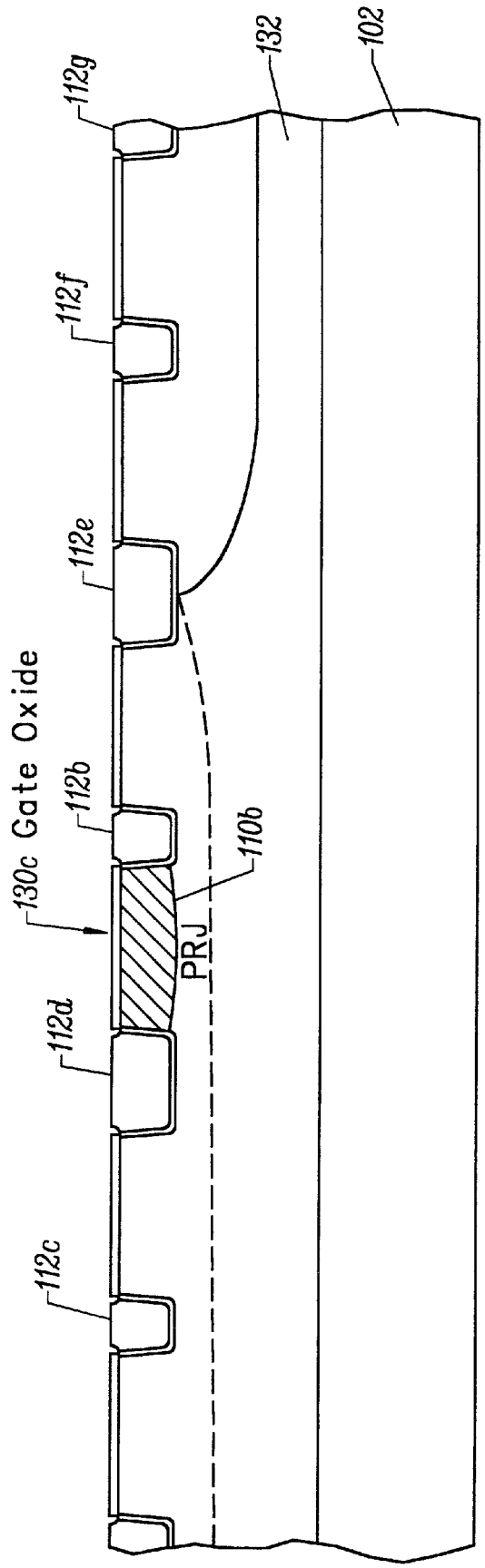
FIG. 2 is a cross-section of a semiconductor substrate during the formation of an $E^2$PROM memory cell showing portions of the cell being formed.
Figure 3:
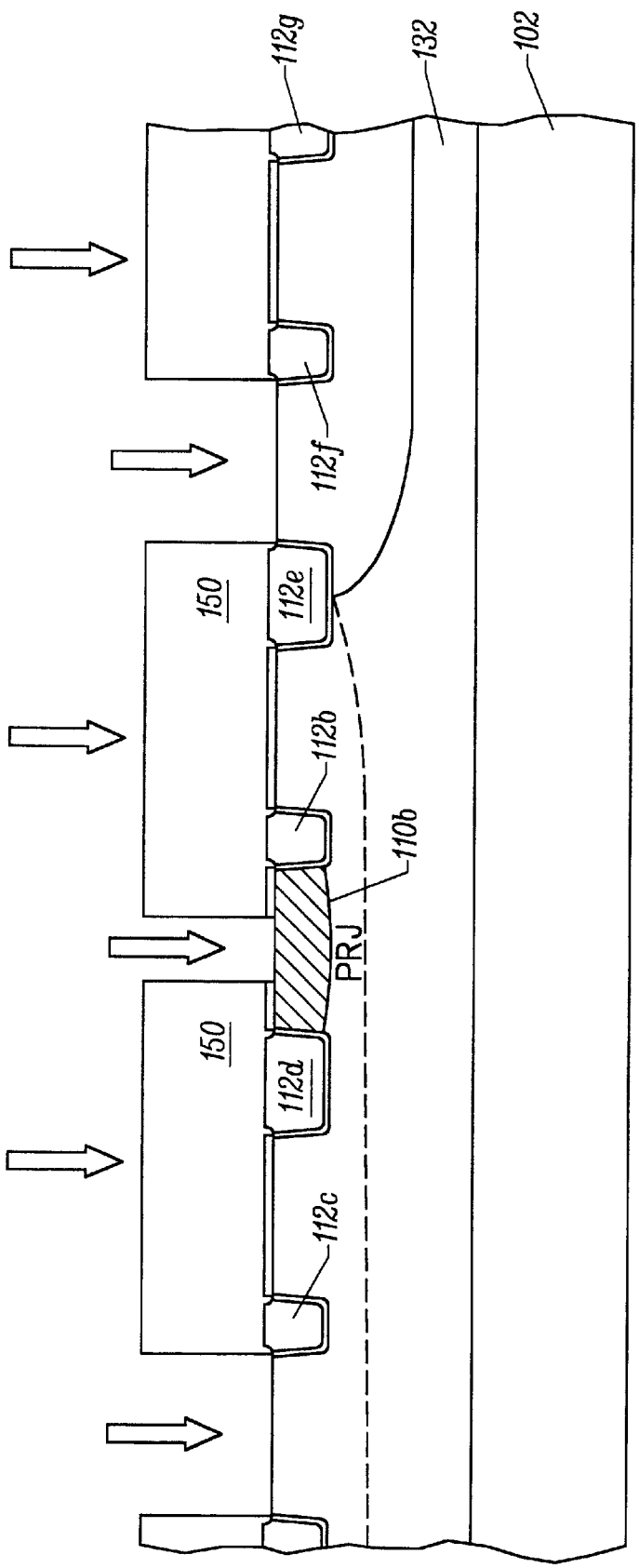
FIG. 3 is a cross-section of a semiconductor substrate of the memory cell shown in FIG. 2 showing, in general, formation of the tunnel oxide region.

FIGS. 2 and 3 illustrate one conventional procedure for forming oxides of varying thickness on a semiconductor substrate, and particularly for forming the gate oxide layer and tunnel oxide regions of an $E^2$ PROM cell. FIG. 2 shows substrate 102 upon which has been formed a well region 132, isolation oxide regions 134a–134e, a gate oxide layer 140, and the program junction region 142. It should be readily understood that numerous process steps are required to reach the cross-section representation of the substrate shown in FIG. 2.

By way of example, the substrate 102 undergoes a number of pre-growth etching, cleaning and implant steps. More specifically, cleaning steps, barrier oxidation steps, and zero level etching steps will have been performed on substrate 102. In addition, well implant regions may be provided in substrate 102 in accordance with known techniques (for example, an implant of boron at $5.6 \times 10^{12}$ atom/cm.$^2$ at 60 KeV). Subsequently, source/drain regions, isolated from each other by field oxide regions, will be formed by depositing, for example, a nitride layer of between 1,500 and 1,800 Å on the substrate, forming a source/drain mask over the nitride layer, and etching the nitride layer leaving portions of the layer covering the source/drain regions. It should be recognized that the wells may be formed subsequent to the source/drain pattern etch.

Subsequently, device isolation regions may be formed in the substrate. Such regions are typically formed by so-called shallow trench oxidation or local oxidation of silicon (LOCOS) processes. In a LOCOS process, for example, isolation regions 134a–134e are formed in substrate 102 by placing the substrate in an atmosphere of oxygen with 0.5% HCl at a temperature of about 1,100 to 1,1500 Celsius to form oxide regions 134a–134e having a thickness of between 3,700 and 4,300 Å. As is well known, the nitride portions remaining on the substrate cover the source/drain regions and prevent field oxidation in these regions. An etch back is subsequently performed on the field oxide layer and the nitride layer removed leaving source/drain substrate regions remaining between field oxide regions 134a–134e.

Additional processing steps include: forming the program junction through the use of a program junction mask layer, implant and anneal; an n-channel field mask and implant; a cell mask and implant; high-voltage n-type implant; high-voltage p-type implants; punch-through masking and implants; and a high-voltage gate oxide cleaning step.

Gate oxidation layer 130c is also conventionally formed by placing the structure shown in FIG. 2 without the associated gate oxide layer in an oxygen-containing atmosphere 900° C. for approximately thirty minutes to create a gate oxide layer having an initial thickness of approximately 125 Å on a substrate and 150 Å on a program junction. As shown in FIG. 3, a resist mask 150 is used to cover portions of the oxide and an oxide etch performed. A second oxidation simultaneously forms the tunnel oxide 130b, oxide layers 130a and 130d to a thickness of approximately 150 Å in the etched regions and oxide layer 130c has a thickness of approximately 180 Å. Subsequent steps are utilized to complete formation of the cell with a cross-section similar to that shown in FIG. 1.

The process of the present invention is useful in, for example, annealing implanted nitrogen into a semiconductor substrate to a shallow junction depth in order to allow for differential oxide growth. However, it will be readily recognized that the process of the present invention is more broadly applicable to annealing any region of the substrate wherein a processing technique has been utilized to deposit or impart a reaction-inhibiting agent to the substrate and has, as a result, damaged the substrate.

Conventionally, ion implantation is a useful process for providing dopants in the semiconductor substrate, but it does have certain drawbacks. With respect to providing small transistor geometries, one critical limitation is that the silicon substrate can be damaged by the implant process. Damage caused by the implant process necessitates a subsequent annealing at high temperature to cure the damage. This annealing step can itself lead to unpredictability in the migration of other dopants in the structure being processed. In addition, the implant will cause a region of damage adjacent to the substrate surface which will prohibit the growth of extremely thin oxide layers.

An alternative form of doping which has heretofore not been widely used in processing semiconductor devices is gas immersion laser doping (GILD). Generally, with laser doping, the silicon surface is exposed to intense irradiation by an excimer laser for a period lasting only several nanoseconds (approximately 50 ns or less). During this period, the silicon surface transitions from solid to liquid, at which time dopants diffuse into the liquid silicon.

Specifically, laser doping uses an excimer laser, often as XeCl laser, as an energy source. In projection gas immersion laser doping (P-GILD), a reflective reticle is used. The output of the laser is directed through optics to homogenize the beam and then passed through an illuminator to scan the beam over a dielectric reticle. The reticle is then imaged, via projection optics, onto the wafer. In the illuminated areas, the incident photon energy is absorbed in approximately the top 7 nm of the silicon and converted to thermal energy, heating the surface and activating the diffusion of the impurities into the substrate. More information with respect to laser doping is contained in Weiner & McCarthy, "Fabrication of sub-40-nm p-n junctions for 0.18 $\mu$m MOS device applications using a cluster-tool-compatible, nanosecond thermal doping technique," Microelectronic Processes, Sensors, & Controls, Vol. 2091 (Int'l Soc. for Optical Eng., September 1993), and a detailed analysis of laser doping techniques, see Stanford University Ph.D. Thesis by Emi Ishida entitled "New Methods of Shallow Junction Formation in Silicon Using Gas Immersion Laser Doping" (November 1994), hereby specifically incorporated by reference.

The process of the present invention can be utilized with any of the aforementioned techniques to cure damage caused by an implant or solid phase diffusion. As such, improved manufacturing of shallow junction depth dopant regions, small geometry transistors and, in particular, multiple thickness oxide regions, is realized.

Figure 4:
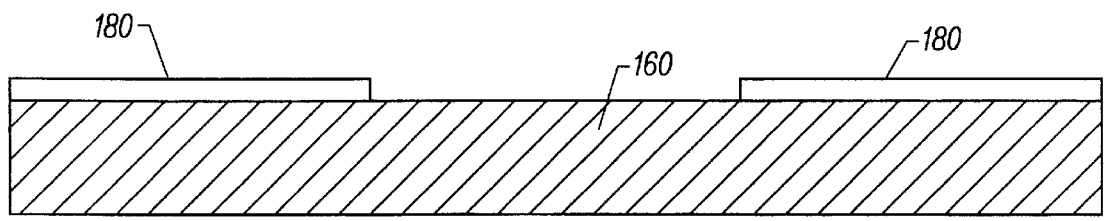
FIGS. 4–8 are cross-sections of a semiconductor substrate showing a first embodiment for forming a nitrogen region employing an oxide on the surface of the substrate.
Figure 5:
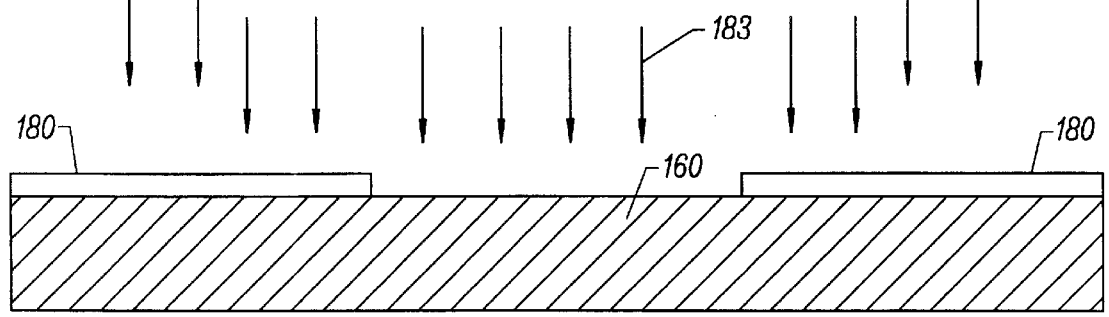

FIGS. 4–8 show the first embodiment of the present invention for annealing a damaged implant or dopant region, and for forming an oxide layer having at least a first thickness and a second thickness. FIG. 4 shows a semiconductor substrate 160 having formed thereon a mask layer 180. Mask layer 180 can comprise an oxide, or a photoresist layer. As shown in FIG. 5, an ion implant represented by arrows 183 of an impurity, in general to a depth ($x_j$) of about 150 nm, to form an implant region 170 (FIG. 6), is performed. The implant can be a conventional process of beam line ion implantation, plasma source ion implantation, or the like, which imparts dopant into the substrate by directional implantation.

Figure 6:
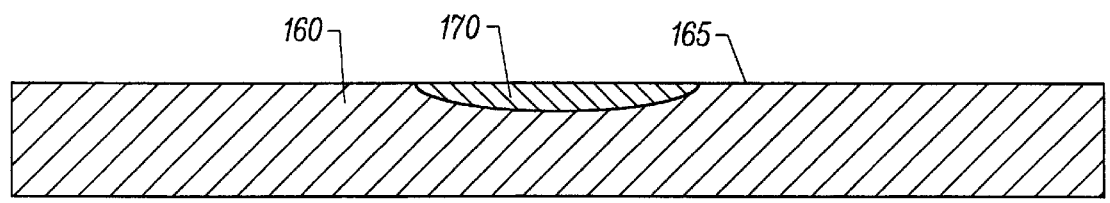

Such implantation will result in region 170, shown in FIG. 6, but will cause damage to the surface 165 of semiconductor substrate 160. In order to form operational semiconductor devices, and, for example, utilize an extremely thin oxide region over implant region 170, this damage must be removed. Conventional annealing techniques have been traditionally limited due to the potential for migration of impurities in the substrate and potential damage to other devices.

Figure 7:
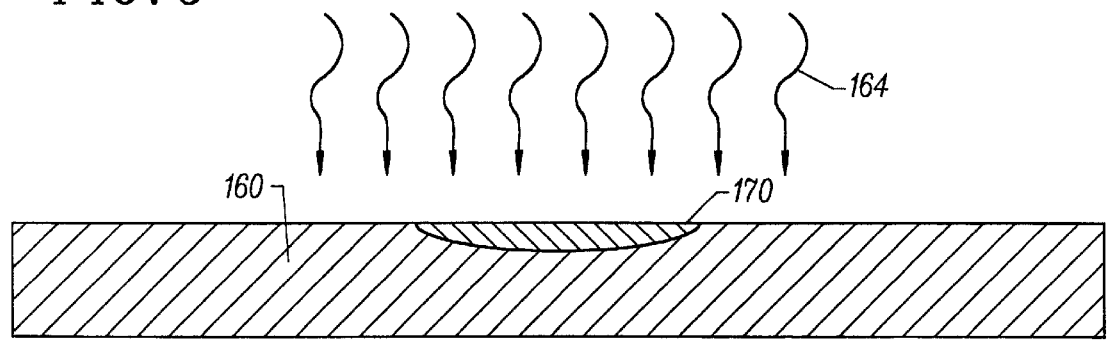

In accordance with the present invention, as shown in FIG. 7, laser energy represented by arrows 164 may be applied selectively to the surface of substrate 160 to melt the surface of the selected region to a sufficient junction depth to completely liquify the substrate to the depth of implant region 170. This can be accomplished by using a spatially homogenized 308 nm XeCl pulsed laser. The energy and power of the laser can vary in accordance with different applications. By melting the surface area of the substrate, within one microsecond the silicon will cool and reform epitaxially, thereby removing any damage incorporated by the implant process. The energy fluence of the laser at the surface of the sample determines the duration of the melt which occurs at the surface. The melt duration is related to the maximum melt depth. The relationship between melt time and maximum melt depth depends on the temporal profile of the laser beam. Precise control of junction depth is possible due to the capability of measuring the full width height maximum (FWHM) of the laser and the surface melt duration during the laser doping process. Relatively large changes in the energy fluence are required to create small changes in the maximum melt depth. The dosage is controlled by the total melt time. The total melt time can be varied by varying the number and/or energy of the laser pulses.

A laser having energy of approximately 750 mJ/cm$^2$ to 1.3 J/cm$^2$ results in junction depths ranging from 20 nanometers to 150 nanometers from a 308 nm excimer laser at a 9 Hz repetition rate.

The energy of the laser applied in this step can be controlled to an accuracy necessary to melt only the surface of the substrate to a depth that the dopant has been implanted into the substrate. The silicon is molten for approximately 30–100 nanoseconds. It will cool in approximately 1 microsecond. Upon cooling, the silicon will reform as epitaxial silicon and any damage which is imparted to the surface of the substrate 160 during the dopant process will be removed.

It should be recognized that the laser annealing method of the present invention can be utilized in accordance with other technologies. For example, a non-melt GILD (Gas Induced Laser Doping) process as described in co-pending application Ser. No. 08/799,153, now U.S. Pat. No. 5,904,575 entitled METHOD AND APPARATUS INCORPORATING NITROGEN SELECTIVELY FOR DIFFERENTIAL OXIDE GROWTH, inventors E. Ishida, et al., filed concurrently herewith, may also impart damage to the substrate. In a GILD process, a substrate is placed in a dopant-containing atmosphere and laser energy utilized to incorporate or deposit a reaction-inhibiting impurity. A reflective reticle may be used in the application of imparting or depositing the dopant using the GILD process; the process does not require a separate masking layer, although a reflective masking layer such as aluminum, tungsten, silicon nitride, molybdenum, silicon nitrate or the like, may be utilized. Laser energy is applied through the dopant-containing atmosphere to form a dopant-containing region, similar to 170, in the substrate. Absorbed dopant gas species diffuse into the molten silicon layer, and dopants are incorporated upon epitaxial regrowth. In a non-melt GILD process, the energy of the laser is reduced and the repetition rate of the laser pulser increased to provide solid phase diffusion of the dopant.

Figure 8:
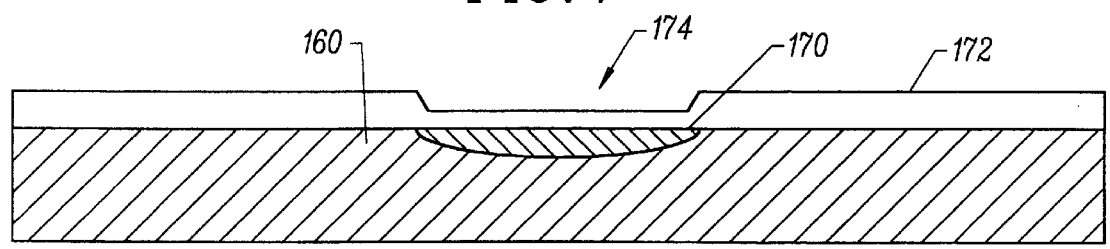

Subsequently, as shown in FIG. 8, substrate 160 can be placed in an oxygen-containing atmosphere at a temperature of approximately 900° sufficient to thermally oxidize the surface of the substrate to grow an oxide layer 172 having a sufficient thickness on undoped regions of substrate 160, while growth in region 174 is inhibited by the laser annealed reaction-inhibiting impurity region 170. The resulting oxide region will have a first thickness of approximately 80–100 Å in region 174, and a second thickness of approximately 140–180 Å in the undoped regions of the substrate. It should be recognized that the concentration of the reaction-inhibiting agent may be so dense as to completely inhibit oxide growth.

The many features and advantages of the present invention should be apparent to one of average skill in the art. All such features and advantages are intended to be within the scope of the invention as defined by the present specification, and the following claims. It should be recognized that the method of the present invention is not limited to its uses in memory technology, but would be applicable in any semiconductor method fabrication process requiring varying levels of oxide on a semiconductor substrate. The method of the present invention possesses the advantages of eliminating a separate masking step in order to etch away a portion of an existing oxide layer to grow a lower level oxide, and provide the advantage of reducing the number of steps in the process. The present invention provides a unique method for introducing nitrogen into a shallow region in the silicon substrate in order to enable differential oxide growth and thus enabling such regions to cause differential oxide growth in small geometry devices.

What is claimed is:

1. A method of forming a region of impurity in a semiconductor wafer substrate having a surface, comprising sequential steps of:
    (a) imparting a surface oxidation-inhibiting impurity into the semiconductor substrate to a depth below the surface of the semiconductor substrate to form a surface oxidation-inhibiting impurity region;
    (b) applying a first laser energy to the semiconductor substrate at a sufficient magnitude to liquify the semiconductor substrate in the surface oxidation-inhibiting impurity regions to repair the surface of the semiconductor substrate damaged by the step (a); and
    (c) growing an oxide region on the surface of the semiconductor substrate such that the oxide region grows at a first rate over the surface oxidation-inhibiting impurity region and a second rate on the surface not over the surface oxidation-inhibiting impurity region, wherein the first rate is different from the second rate and the oxide region produced by the first rate has a thickness measuring up to about 100 Å.

2. The method of claim 1 wherein the oxidation-inhibiting impurity is nitrogen.

3. The method of claim 2 wherein the step (a) comprises:
    (a) applying a second laser energy to the surface of the semiconductor substrate to perform a non-melt gas immersion laser doping of the nitrogen in the semiconductor substrate.

4. The method of claim 1 wherein the step (a) comprises ion implanting the impurity into the substrate.

5. The method of claim 1 wherein the first thickness is zero.

6. The method of claim 1 wherein the step (b) comprises applying the first laser energy from an excimer laser.

7. The method of claim 1 wherein the step (b) comprises applying the first laser energy from an XeCl laser having a wavelength of 308 nm at an energy in a range of 750 mJ/cm$^2$–1.3 J/cm$^2$.

8. The method of claim 1 further including the steps, prior to the step (a), of forming a mask layer on the surface of the semiconductor substrate, and patterning the mask layer to expose an area overlying at least one portion of the surface of the semiconductor substrate into which the surface oxidation-inhibiting impurity is to be imparted.

9. A method of forming a device including an impurity region in a semiconductor wafer substrate having a surface, comprising sequential steps of:
    (a) forming a mask layer on the surface of the semiconductor substrate;
    (b) patterning the mask layer to expose an area overlying at least one portion of the surface of the semiconductor substrate into which a oxidation-inhibiting impurity is to be implanted;

(c) ion implanting the oxidation-inhibiting impurity into said at least one portion of the surface to form the impurity region in the semiconductor substrate to a depth below the semiconductor substrate;

(d) applying laser energy to the semiconductor substrate at a sufficient magnitude to liquify the semiconductor substrate in the impurity region to repair the surface of the semiconductor substrate damaged by the step (c); and (e) growing an oxide layer having a first thickness at the surface overlying the impurity region and a second thickness on the surface without the impurity region, wherein the first thickness measures up to about 100 Å and the first thickness is different from the second thickness.

10. The method of claim 9 wherein the impurity is nitrogen.

11. The method of claim 9 wherein the step (d) comprises applying laser energy from an excimer laser.

12. The method of claim 9 wherein the step (d) comprises applying laser energy from an XeCl laser having a wavelength of 308 nm at an energy in a range of 750 mJ/cm$^2$–1.3 J/cm$^2$.

13. The method of claim 9 wherein the first thickness is less than the second thickness.

14. A method for forming a semiconductor device in a silicon wafer substrate having a surface, comprising sequential steps of:

(a) forming a region containing nitrogen in the substrate to a depth below the surface of the substrate;

(b) applying a first laser energy to the surface of the substrate at a sufficient energy and for a sufficient time to melt the surface of the substrate to at least said depth, thereby liquefying a portion of the region containing the nitrogen in the substrate to repair the surface of the substrate damaged by the step (a); and (c) growing an oxide layer having a first thickness on the surface of the substrate above the nitrogen region and a second thickness on the surface not above the nitrogen region, wherein the first thickness measures up to about 100 Å and the first thickness is different from the second thickness.

15. The method of claim 14 wherein the step of forming comprises:

(a) placing the substrate in an atmosphere of nitrogen; and (b) applying a second laser energy to the surface of the substrate to complete a non-melt gas immersion laser doping of the nitrogen in the substrate.

16. The method of claim 14 wherein the step of forming comprises ion implanting the nitrogen into the substrate.

17. The method of claim 14 further including the steps, prior to the step (a), of forming a mask layer on the surface of the substrate, and patterning the mask layer.

18. The method of claim 14 wherein the first thickness is less than the second thickness.

19. A method for forming an oxide on a surface of a silicon wafer substrate, comprising sequential steps of:

(a) forming a mask layer on the surface of the substrate;

(b) patterning the mask layer to expose portions of the substrate into which nitrogen is to be implanted;

(c) implanting the nitrogen into a portion of the substrate to a depth below the surface of the substrate;

(d) applying laser energy to the surface of the substrate at a sufficient energy and time to melt the surface of the substrate to a depth below the surface thereby repairing the surface of the substrate damaged by the step (c); and (e) forming an oxide on the surface of the substrate, at least a portion of the oxide being formed over the portion of the substrate containing the nitrogen, wherein the portion of oxide being formed over the portion of the substrate containing the nitrogen measure up to about 100 Å.

20. The method of claim 19 wherein the step of implanting comprises:

(a) placing the substrate in an atmosphere of a compound having nitrogen; and (b) applying laser energy to the surface of the substrate to complete a non-melt gas immersion laser doping of the nitrogen in the substrate.

21. The method of claim 19 wherein the step of implanting comprises ion implanting the nitrogen into the substrate.

22. The method of claim 19 wherein the step (d) comprises applying the energy from an excimer laser.

23. The method of claim 19 wherein said step (d) comprises applying the energy from an XeCl laser having a wavelength of 308 nm at an energy in a range of 750 mJ/cm$^2$–1.3 J/cm$^2$.

* * * * *